United States Patent
Xin et al.

(10) Patent No.: US 6,795,507 B1
(45) Date of Patent: Sep. 21, 2004

(54) METHOD AND APPARATUS FOR TURBO DECODING OF TRELLIS CODED MODULATED SIGNAL TRANSMISSIONS

(75) Inventors: Weizhuang Xin, Aliso Viejo, CA (US); Ning Kong, Long Beach, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/410,220

(22) Filed: Sep. 30, 1999

(51) Int. Cl.[7] .................... H04L 23/02; H03M 13/00
(52) U.S. Cl. .............................. 375/265; 714/755
(58) Field of Search ................... 375/265, 316, 375/295, 341; 714/755, 794, 795

(56) References Cited

U.S. PATENT DOCUMENTS

| | | | |
|---|---|---|---|
| 6,029,264 A | * 2/2000 | Kobayashi et al. | 714/755 |
| 6,304,995 B1 | * 10/2001 | Smith et al. | 714/786 |
| 6,353,911 B1 | * 3/2002 | Brink | 714/780 |

OTHER PUBLICATIONS

Benedetto, S., and Montorsi, G. "A Soft–Input Soft–Output APP Module for Iterative Decoding of Concatentaed Codes," IEEE Comm. Letters, vol. 1, No. 1, Jan. 1997.*

* cited by examiner

Primary Examiner—Khai Tran
(74) Attorney, Agent, or Firm—Christopher J. Rourk; Goodwin Gruber, L.L.P.

(57) ABSTRACT

An implementation of an iterative decoding system within a Trellis Coded Modulation communications environment. In a disclosed embodiment of the present invention, a communication system is described wherein the transmitter uses a channel encoder (consisting of either a convolutional encoder or a block encoder) as an outer encoder. The channel encoded signal is then passed through an interleaver and provided to a Trellis Coded Modulation encoder which acts as an inner encoder. The encoded signal may then be transmitted over the channel. On the decoding side, the disclosed embodiment of the present invention advantageously applies iterative decoding steps to decode the received Trellis Coded Modulated signals, resulting in improved coding gains and a decrease in BER as compared with a conventional non-iterative approach.

18 Claims, 4 Drawing Sheets

US 6,795,507 B1

METHOD AND APPARATUS FOR TURBO DECODING OF TRELLIS CODED MODULATED SIGNAL TRANSMISSIONS

INCORPORATIONS BY REFERENCE

The following commonly-assigned patent application is hereby incorporated by reference in its entirety, including drawings and appendices, and is hereby made part of this application for all purposes:

1) U.S. patent application Ser. No. 09/038,724, filed Mar. 10, 1998; and
2) U.S. patent application Ser. No. 08/923,722, filed Sep. 4, 1997.

FIELD OF THE INVENTION

The present invention relates generally to hardwired or wireless communication systems; and, more particularly, to a system and method for correctly receiving and decoding transmissions in noisy digital communication environments.

BACKGROUND OF THE INVENTION

Generally, communication channels are limited in transmitter power and spectrum availability. This restricts the amount of information, which may be transmitted over a particular communications environment. High speed data communication services, regardless of various impediments (white gaussian noise or impulsive noise) must fit within the limited bandwidth of spectrum availability provided by the physical medium, or the available frequency spectrum band.

Representative services utilizing wireless networks include telephony, videotelephony, and high-speed data transmission. These services have varying and distinguishable transmission needs which include being in high demand for access, being delay critical, requiring high bandwidth, and/or being intolerant of errors. These different services also have different encoding requirements, different transmission error requirements and different delay requirements. The trade-offs of these different requirements, when the services are integrated into a single cohesive whole, lead to limitations of the network to transmit and receive a large amount of information quickly, correctly and simultaneously.

Further, radio communications are limited in transmitter power and spectrum availability. This also restricts the amount of information which may be transmitted over an air interface. Broadband communication services must fit within the limited narrowband spectrum on an air interface network. Additionally, radio transmission is significantly more error prone than broadband hard-wired networks. This tends to further reduce capacity due to the necessity to transmit and process error control protocols.

It is therefore a goal of digital communications design to maximize the transmission bit rate R and minimize the probability of bit error, or Bit Error Ratio (BER) and required system power S. The minimum bandwidth (BW) required to transmit at rate (R) was given in Nyquist, H., "Certain Topics on Telegraph Transmission Theory," Trans. Am. Inst. Electr. Eng., Vol. 47, April 1928, p. 617–644, as Rs/2 where Rs is the symbol rate.

A limit on the transmission rate, called the system capacity, is based on the channel BW and the signal to noise ratio (SNR). This limit theorem, also called the Shannon Noisy Channel Coding Theorem, is set forth in Shannon, C. E., "A Mathematical Theory of Communication," Bell Syst. Tech. J., Vol. 27, 1948, pp.379–423, 623–657, and states that every channel has a channel capacity C which is given by the formula, $C=BW \log_2(1+SNR)$, and that for any rate R<C, there exist codes of rate $R_c$ which can have an arbitrary small decoding BER.

Turbo Codes

For some time, the digital communications art has sought a coding/decoding algorithm which would reach the Shannon limit. Recently, coding/decoding schemes, called "Turbo Codes," have been determined to achieve reliable data communication at an SNR which is very close to the Shannon Limit. (Claude Berrou, Alain Glavieux, and Punya Thitimajshima, "Near Shannon Limit Error-Correcting Coding and Decoding: Turbo-Codes", in Proceedings of ICC'93, Geneve, Switzerland, May 1993, pp. 1064–1070). In fact, Telecommunications Industry Association committee TR45.5 developing IS-95 third generation standards have adopted "Turbo Coding" as the algorithm to be used for data transmission rates higher than 14.4 Kbps.

Generally, there are two known transmission system schemes which implement Turbo Coding. These schemes are known as Parallel Concatenated Coding (PCC) and Serial Concatenated Coding (SCC).

A known implementation of PCC is shown in FIG. 1. As shown in FIG. 1, data is input to the encoder 10 at input 11. The data is then processed by a first recursive systematic convolutional coder (RSCC) 12 to provide multiple encoder outputs 13. Each of the set of first encoder outputs 13 provides redundant information representative of the data.

The parallel encoder 10 also sends the data to a second RSCC 14 through interleaver 15. Interleaver 15 reshuffles the bits of information at input 11 according to a predetermined shuffling sequence and then sends them to second RSCC 14. By reshuffling the data bits, the second set of outputs 16 from second RSCC 14 are in a different configuration than at the outputs 13.

In PCC, the various outputs 13, 16 of the first and second RSCC are also "punctured" or taken from the remainder of the outputs 13, 16 and selected for transmission. Puncturing outputs is acceptable for transmission purposes because of the redundancy of information which is created within the encoder 10. Since the signal is being redundantly transmitted from the several outputs 13, 16, eliminating some of the parts of the outputs does not degrade signal performance. After the puncturing of the output, encoder 10 has the same rate as a ⅓ rate convolutional encoder. Therefore, there is no additional bandwidth increase.

Another form of Turbo Coding known in the art is Serial Concatenated Coding (SCC). FIG. 2 shows an illustrated depiction of the architecture used for SCC. As shown in FIG. 2, there is a serial cascade of an outer encoder 31, an interleaver 32 and an inner encoder 33. The signal to be coded and transmitted is input into the outer encoder 31. The output of outer encoder 31 is then fed to interleaver 32 where the signal is shuffled in a predetermined manner. The output of interleaver 32 is then sent to the inner encoder 33 for transmission. Most commonly in the art, both the inner and outer encoders use convolutional codes.

There are a few decoding algorithms known in the art which can be used to decode Turbo codes. By way of example only, an iterative decoding algorithm which may be used to decode SCC is described below.

The basic idea of an iterative Turbo decoding algorithm for SCC transmissions is shown in FIG. 3. As shown in FIG. 3, fresh information is generated and fed back to inner decoder 34 or outer decoder 36 in every iteration to update the previous estimates of the intended signals. Iteration stops when the detected coding gain diminishes below a certain threshold, i.e., when all the information is substantially used. In practice, the number of iterations typically varies from about 5 to 12.

In operation, the first iteration produces the conventional non-iterative estimates in the system of FIG. 3. During the first iteration of the system shown in FIG. 3, soft outputs $S_o$, consisting of the likelihood (or probability) of the information and code symbols, are fed from a demodulator (not shown) into an Inner Soft-Input Soft-Output (SISO) decoder block 34. Inner SISO block 34 operates upon logarithmic likelihood ratios as inputs and outputs. The second input $I_2$ of SISO block 34 is held at zero during-this first iteration. The Inner SISO output $O_1$ is fed into a de-interleaver 35 and then into inputs $I_2'$ of an outer SISO decoder block 36.

During the following iterations, the outer SISO block 36 output $O_2$ is fed back through interleaver 37 to the second input $I_2$ of Inner SISO decoder block 34 until the outer SISO 36 sends the decoded decision output signal along output path $O_2$. Refreshed information is generated and fed back to inner decoder 34 or outer decoder 36 in each iteration through blocks 38, 39 to update the previous estimates of the intended signals.

Trellis Coded Modulation

An important issue in digital communications is the bandwidth BW limitation. It is well known that coding alone provides an effective way to trade off between performance in terms of bit error ratio (BER) and bandwidth BW. If it is not possible to trade off bandwidth BW (i.e., bandwidth BW constrained channels such as the wireless air interface) then a combined coding and modulation scheme may be used to provide a bandwidth BW efficient coding and transmission scheme. One such scheme is Trellis Coded Modulation (TCM), and is discussed in G. Ungerboeck, "Channel coding with multilevel/phase signals," *IEEE Trans. Inform. Theory*, Vol. IT-28, pp.55–67, January 1982.

Trellis Coded Modulation TCM systems generally increase bandwidth BW efficiency and are especially useful in applications which have limited bandwidth BW availability. The basic idea of Trellis Coded Modulation TCM is to map the coded bits onto signal points in an expanded (having more signal points than needed for uncoded transmission) signal set such that the minimum free Euclidean distance between allowable code sequences is maximized. Resulting coding gains are achieved without bandwidth BW expansion.

The typical system architecture for a Trellis Coded Modulation transmitter and receiver is shown in FIG. 4. As shown in FIG. 4, a Trellis Coded Modulation transmitter 50 uses an outer convolutional or block code encoder 51 to encode an input signal $S_1$. The output of the block code encoder 51 is then fed into an interleaver 52 which then feeds into an inner Trellis Code Encoder 53. The output signal $S_2$ is then transmitted over transmission channel 54 to receiver 55 for decoding and processing.

In order to decode the Trellis Coded Modulation signal $S_2$, the signal $S_2$ is separately Trellis Code demodulated and convolutionally or block decoded. The signal $S_2$ is first Trellis decoded by inner Trellis code decoder 56. The Trellis decoded signal is then sent through a reverse interleaver 57 and then decoded by outer cyclic/convolutional decoder 58 to provide output signal $S_3$. The output signal $S_3$ corresponds generally to the input signal $S_1$. The Trellis Coded Modulation Transmitter/Receiver system shown in FIG. 4 is especially useful in cases when both (i) burst/random errors need to be detected/corrected and (ii) coding gains need to be achieved without bandwidth expansion. The outer encoder is convolutional for some other applications and a block coder for other applications. In any case, the traditional decoding algorithm for such systems performs demodulation of Trellis-coded signals and channel decoding separately.

The use of the type of separate decoding exemplified in FIG. 4, however, leads to decreased receiver performance and coding gains.

SUMMARY OF THE INVENTION

Briefly, the present invention implements an iterative decoding system within a Trellis Coded Modulation communications environment. The improved Trellis-coded modulation transmitter and receiver system provides an improved telecommunications system capable of effectively carrying narrowband services while providing the flexibility to carry higher bandwidth services over the narrowband channel.

The present invention recognizes that the system architecture on the transmitter side of Trellis Coded Modulation communications systems can be likened to those of Serially Concatenated Convolutional Coding (SCCC) systems. Following that recognition, the present invention applies interative Turbo decoding to Trellis Coded Modulation signals.

The present invention uses an interative process to accelerate signal decoding and increase receiver performance in a Trellis Coded Modulation environment. In the present invention, the resulting coding gain is substantially greater and the decoding performance is substantially improved with a decrease in BER as compared with a conventional non-iterative approach. Performance similar to SCC Turbo codes is expected.

In a disclosed embodiment of the present invention, the transmitter uses a channel encoder (consisting of either a convolutional encoder or a block encoder) as the outer encoder. The signal to be transmitted is first input into the outer encoder. The channel encoded signal is then passed through an interleaver and fed into a Trellis Coded Modulation encoder which acts as the inner encoder. The encoded signal may then be transmitted over the channel.

On the decoding side, the disclosed embodiment of the present invention advantageously applies iterative decoding to decode the received Trellis Coded Modulated signals. The iterative decoder that is used within the receiver may be similar to the decoder that is applied to Serially Concatenated Coding systems.

The system of the present invention is particularly applicable to data communications applications. The system provides recognizable increases in receiver performance and coding gain, and is capable of effectively carrying narrowband services while providing the flexibility to carry higher bandwidth services over the narrowband channel. In particular, a telecommunications system according to the present invention effectively addresses the differing transmission and spectrum needs of multiple services (such as telephony, videotelephony, and high-speed data transmission), including being delay critical, requiring high bandwidth, and being intolerant of errors.

BRIEF DESCRIPTION OF THE DRAWINGS

The features, organization, advantages and objects of this invention will be fully understood from the following detailed description and the accompanying drawings, in which.

DETAILED DESCRIPTION OF THE INVENTION

Figure 5:
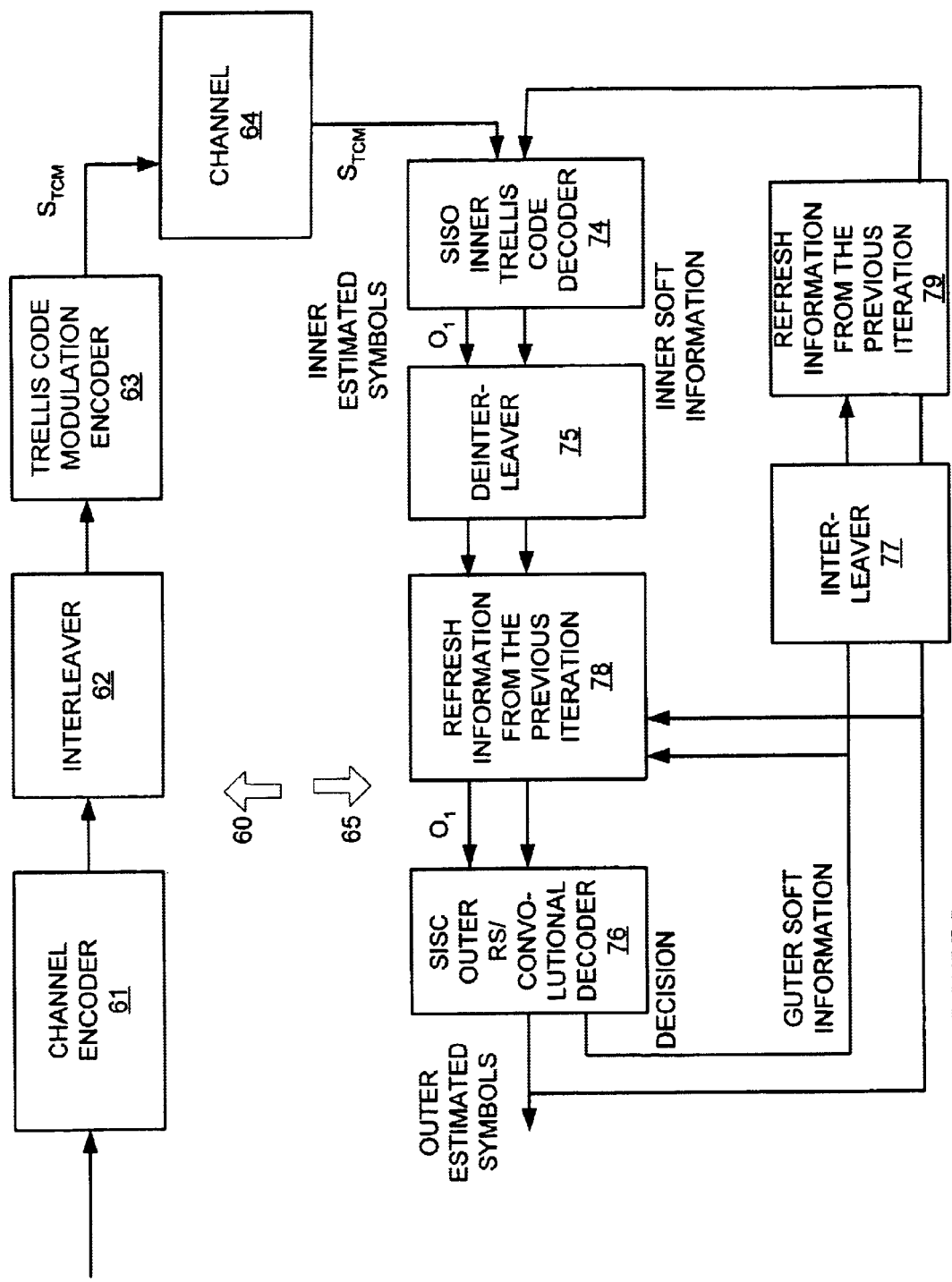
FIG. 5 provides a graphical block diagram depiction of hardware implemented in accordance with the present invention for iteratively decoding Trellis Coded Modulated transmission signals.

FIG. 5 shows a graphical block diagram depiction of an exemplary hardware configuration used to implement an embodiment of the present invention which iteratively decodes Trellis Coded Modulated transmission signals. The system provides recognizable increases in receiver performance and coding gain, and is capable of effectively carrying narrowband services while providing the flexibility to carry higher bandwidth services over the narrowband channel.

As shown in FIG. 5, in the disclosed embodiment of the present invention the transmitter 60 uses a channel encoder as the outer encoder 61. The channel encoder 61 may be either a convolutional encoder or a block encoder such, as a Reed-Solomon encoder. The signal $S_6$ to be transmitted is first input into the outer encoder 61. The channel encoded signal output from outer encoder 61 is then provided to an interleaver 62. The interleaver 62 functions to reshuffle the encoded signal according to a predetermined shuffling sequence. The output of the interleaver 62 is provided to a Trellis Coded Modulator which acts as a inner encoder 63. The encoded signal $S_{TCM}$ is then transmitted over the channel 64.

Figure 1:
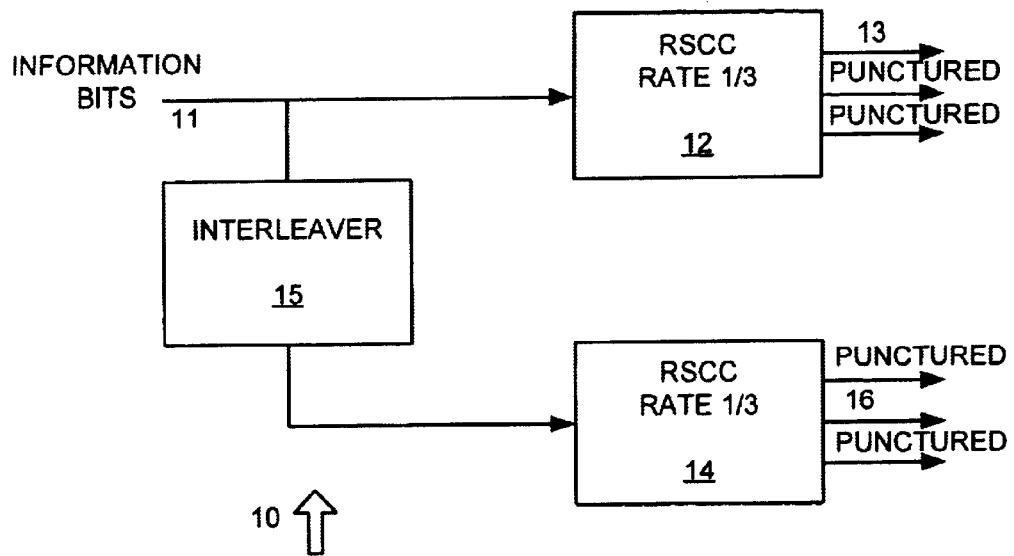
FIG. 1 provides a graphical block diagram depiction of a Parallel Concatenated Coding (PCC) system used to transmit signals over an air interface.
Figure 2:
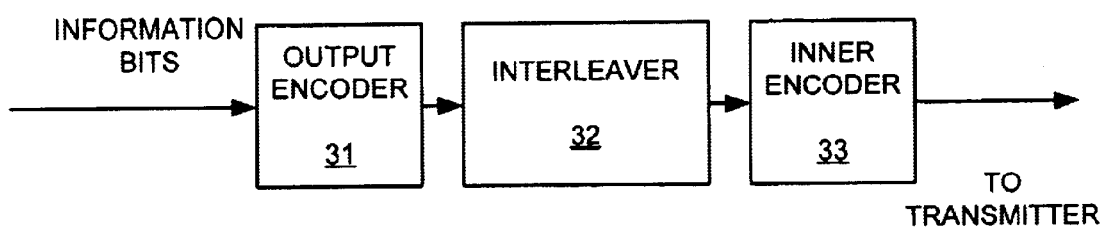
FIG. 2 provides a graphical block diagram depiction of a Serial Concatenated Coding (SCC) system used to transmit signals over an air interface.
Figure 3:
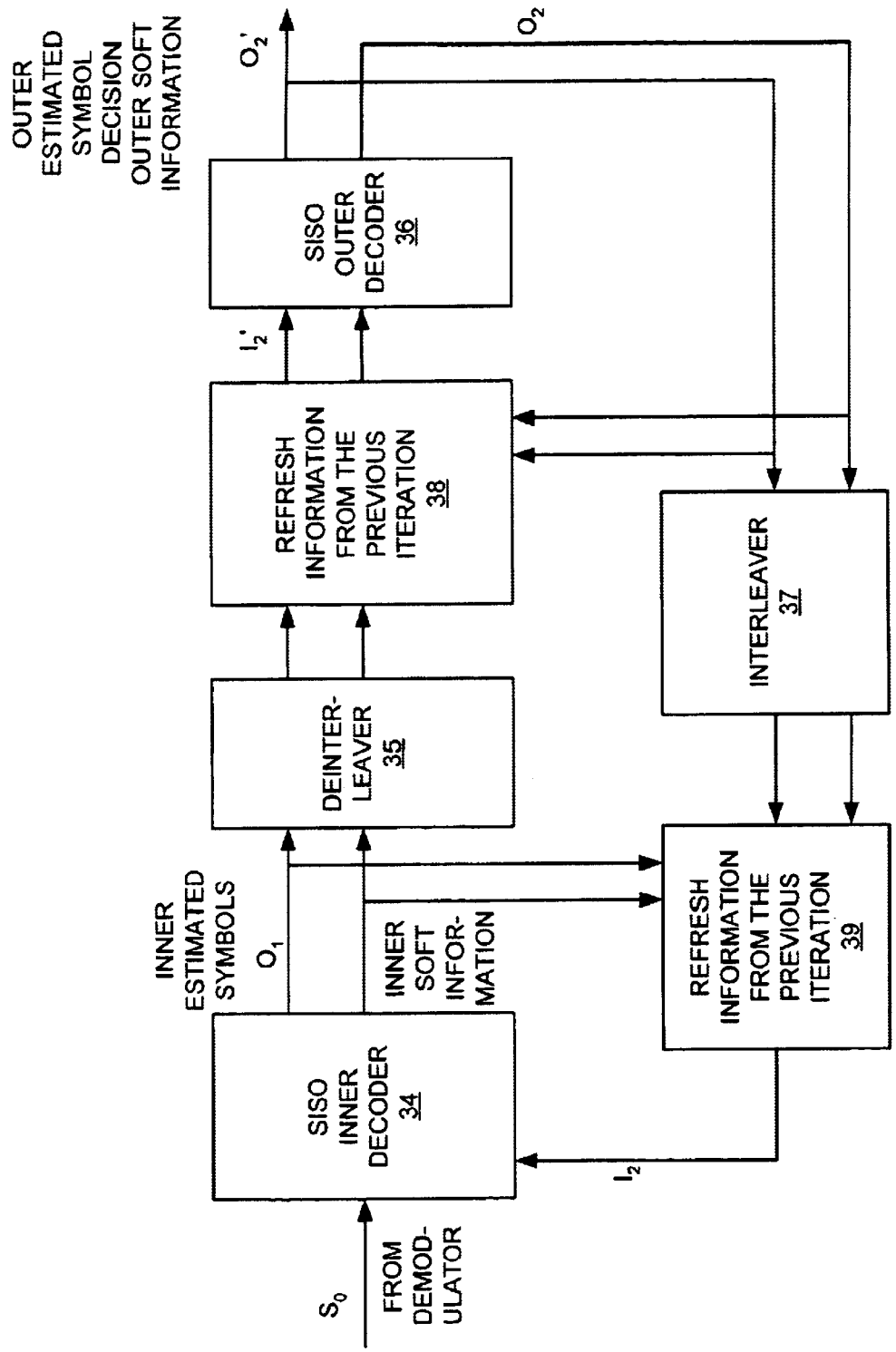
FIG. 3 provides a graphical block diagram depiction of a conventional architecture to iteratively decode SCC signals transmitted by the system shown in FIG. 2.
Figure 4:
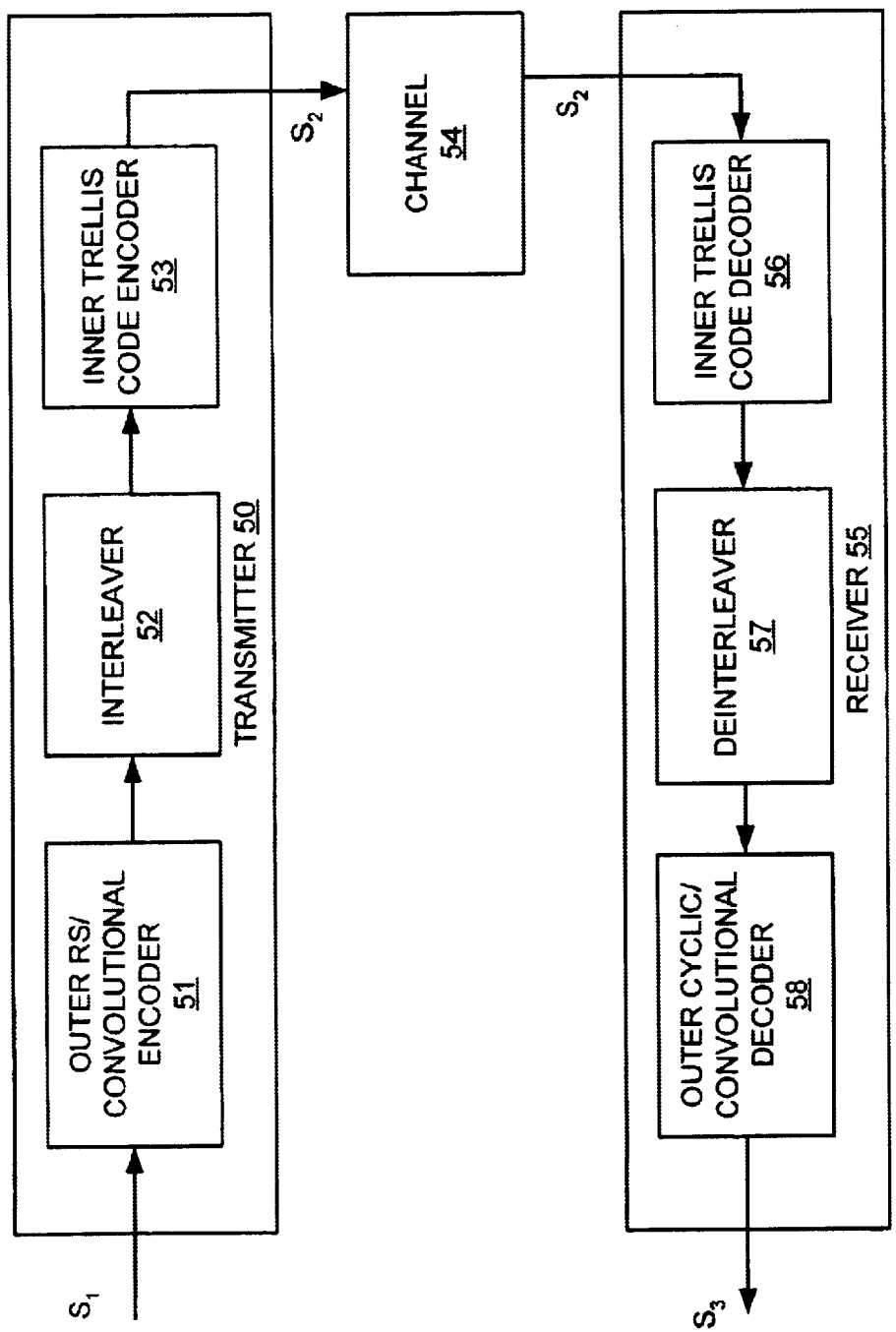
FIG. 4 provides a graphical block diagram depiction of a conventional Trellis Coded Modulation transmitter/receiver system.

The receiver 65 of the preferred embodiment of the present invention applies an iterative algorithm perform both the demodulation of the Trellis-Coded Modulation signals and channel decoding. The iterative decoder is similar to those that are normally applied to decode transmissions from Serially Concatenated Coding systems as shown in FIG. 3.

As shown in the receiver 65 of FIG. 5, fresh information is generated and fed back to inner decoder 74 or outer decoder 76 in every iteration to update the previous estimates of the intended signals. Iteration stops when the detected coding gain diminishes below a certain threshold, i.e., when all the information is pretty much used. In practice, the number of iterations of the disclosed embodiment of the present invention typically varies from about 5 to 12.

In operation, the first iteration of the receiver 65 of the disclosed produces the non-iterative estimates of the output signal. During the first iteration of the system, the signal $S_{TCM}$, consisting of probability distributions of the information and code symbols, is fed into an Inner Soft-Input, Soft-Output (SISO) decoder block 74. Inner SISO block 74 operates upon logarithmic likelihood ratios as inputs and outputs. The second input $I_2$ of SISO block 74 is held at zero during this first iteration. The Inner SISO output $0_1$ is fed into a de-interleaver 75 and then into inputs $I_2'$ of an outer SISO decoder block 76.

During the following iterations, the outer SISO block 76 output $0_2$ is fed back through interleaver 77 to the second input $I_2$ of Inner SISO decoder block 74 until the outer SISO 76 sends the decoded decision output signal along output path $0_2'$. Refreshed information is generated and fed back to inner decoder 74 or outer decoder 76 in each iteration through blocks 78, 79 to update the previous estimates of the intended signals.

Thus, the disclosed embodiment of the present invention applies an iterative turbo decoding process to a Trellis Coded Modulation transmitted signal to quicken signal decoding and increase receiver performance in a Trellis Coded Modulation communications environment. In the present invention, the resulting coding gain will be substantially greater and the decoding performance will be substantially improved with a decrease in BER as compared with a conventional non-iterative approach, since the present invention recognizes that in an iterative approach more information is used with each iteration to produce better estimates.

In view of the above detailed description of the present invention and associated drawings, other modifications and variations will now become apparent to those skilled in the art. It should also be apparent that such other modifications and variations may be effected without departing from the spirit and scope of the present invention.

We claim:

1. A communication system, comprising:
    a transmitter for transmitting a signal including a channel encoder as an outer encoder for encoding an input signal and a Trellis Code Modulation encoder as an inner encoder for encoding the input signal; and
    a receiver receiving the transmitted signal and applying an iterative algorithm to perform both Trellis Coded Modulation decoding of the transmitted signal and channel decoding of the transmitted signal to produce the input signal.

2. The communication system of claim 1 wherein the iterative algorithm is a Serially Concatenated Coding system decoder.

3. The communication system of claim 1, wherein the transmitter further comprises an interleaver receiving the output from the channel encoder, shuffling the output from the channel encoder and providing an interleaver output to the Trellis Code Modulation encoder.

4. The communication system of claim 1, wherein the channel encoder is a convolutional encoder.

5. The communications system of claim 1, wherein the channel encoder is a block encoder.

6. The communication system of claim 1, wherein the receiver further comprises:
    an inner Soft-Input, Soft-Output Trellis Code Decoder, the inner decoder receiving the Trellis Code Modulated signal and providing estimates of encoded information as an inner decoder output;
    a de-interleaver, the de-interleaver receiving the decoder output, reverse shuffling the decoder output a predetermined amount, and providing a de-interleaver output;
    an outer Soft-Input, Soft-Output channel decoder, the outer decoder receiving the de-interleaver output and providing estimates of the information; and
    a decoder interleaver, the decoder interleaver receiving the estimates of the information, re-shuffling the estimates of the information the predetermined amount, and providing a decoder interleaver output to the inner decoder.

7. The system of claim 6, further comprising a memory for storing information indicative of the outputs during each iteration and inputting the stored information to the decoders, the memory being refreshed during each iteration.

8. A method of communication, comprising:

performing channel encoding of a signal to as an outer encoding;

performing Trellis Code Modulation encoding of the channel encoded signal as inner encoding;

transmitting the Trellis Code Modulated signal across a channel;

receiving the Trellis Code Modulated signal representation; and iteratively re-decoding the Trellis Code Modulated signal to perform inner decoding and outer decoding.

9. The communications method of claim 8, wherein the channel encoding is convolutional encoding.

10. The communications method of claim 8, wherein the channel encoding is block encoding.

11. The communications method of claim 8, further comprising:

providing estimates of encoded information from the received Trellis Code Modulated signal representation of the information;

de-interleaving the estimates of encoded information by reverse shuffling the estimates of encoded information by a predetermined amount;

providing estimates of the information from the de-interleaved estimates of encoded information;

re-interleaving the estimates of the information by reshuffling the estimates of the information the predetermined amount; and iteratively combining the re-interleaved estimates of the information with the received Trellis Code Modulated signal representation of the information.

12. The communications method of claim 11, further comprising;

storing information indicative of processed information during each iteration;

recombining the stored information with unprocessed information; and refreshing the stored information during each iteration.

13. A system for transmitting and receiving a data signal comprising:

a channel encoder receiving the data signal and performing outer encoding of the data signal;

an interleaver reshuffling the outer encoded data signal;

a Trellis Code Modulation encoder performing inner encoding of the reshuffled outer encoded data signal to produce a transmitted signal; and a receiver receiving the transmitted signal and applying an iterative algorithm to perform both Trellis Code Modulation decoding and channel decoding of the transmitted signal to produce the data signal.

14. The system of claim 13 wherein the receiver further comprises a Trellis Code Modulation decoder receiving the transmitted signal and performing inner decoding of the transmitted signal.

15. The system of claim 14 wherein the receiver further comprises a de-interleaver de-interleaving the inner decoded transmitted signal.

16. The system of claim 15 wherein the receiver further comprises a refresher receiving information from a previous iteration and refreshing the de-interleaved inner decoded transmitted signal.

17. The system of claim 16 wherein the receiver further comprises an outer decoder receiving the refreshed de-interleaved inner decoded transmitted signal and providing an outer estimated signal and the refresh information from the previous iteration.

18. The system of claim 17 wherein the receiver further comprises an interleaver receiving the refresh information from the previous iteration and providing the interleaved refresh information from the previous iteration to the Trellis Code Modulation decoder.

* * * * *